United States Patent
Lin et al.

(10) Patent No.: US 12,003,249 B2
(45) Date of Patent: Jun. 4, 2024

(54) DIGITAL-TO-ANALOG CONVERSION CIRCUIT AND METHOD HAVING SIGNAL CALIBRATION MECHANISM

(71) Applicant: REALTEK SEMICONDUCTOR CORPORATION, Hsinchu (TW)

(72) Inventors: Kai-Yue Lin, Hsinchu (TW); Hsuan-Ting Ho, Hsinchu (TW); Liang-Wei Huang, Hsinchu (TW); Chi-Hsi Su, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 176 days.

(21) Appl. No.: 17/861,393

(22) Filed: Jul. 11, 2022

(65) Prior Publication Data

US 2023/0036760 A1    Feb. 2, 2023

(30) Foreign Application Priority Data

Jul. 13, 2021    (TW) .................................. 110125698

(51) Int. Cl.
 *H03M 1/10*    (2006.01)
 *H03M 1/66*    (2006.01)
 *H03M 1/74*    (2006.01)

(52) U.S. Cl.
 CPC ........... *H03M 1/1023* (2013.01); *H03M 1/10* (2013.01); *H03M 1/66* (2013.01); *H03M 1/742* (2013.01)

(58) Field of Classification Search
 CPC ............................ H03M 1/1023; H03M 1/742
 (Continued)

(56) References Cited

U.S. PATENT DOCUMENTS

| 8,536,899 B1 * | 9/2013 | Lu ....................... H03M 1/1061 327/51 |
| 10,693,483 B1 | 6/2020 | Luo |

(Continued)

OTHER PUBLICATIONS

OA letter of a counterpart TW application (U.S. Appl. No. 10/693,483) dated Mar. 3, 2022. Summary of the TW OA letter: 1. Claims 1-2 and 6-7 are rejected as allegedly being unpatentable in view of cited reference 1 (U.S. Appl. No. 10/693,483 B1) and cited reference 2 (US 2006/0114138 A1). 2. Claims 3-5 and 8-10 are allowable. Correspondence bewteen claims of TW counterpart application and claims of US application: 1. Claims 1, 2-3, . . . , and 10 in TW counterpart application correspond to claims 1, 2-3, . . . and 10 in US application, respectively.

(Continued)

*Primary Examiner* — Peguy Jean Pierre
(74) *Attorney, Agent, or Firm* — WPAT, P.C

(57) ABSTRACT

The present invention discloses a DAC method having signal calibration mechanism used in a DAC circuit having thermometer-controlled current sources generating an output analog signal according to a total current thereof and a control circuit. Current offset values of the current sources are retrieved. The current offset values are sorted to generate a turn-on order, in which the current offset values are separated into current offset groups according to the turn-on order, the signs of each neighboring two groups being opposite such that the current offset values cancel each other when the current sources turn on according to the turn-on order to keep an absolute value of a total offset not larger than a half of a largest absolute value of the current offset values. The current sources are turned on based on the turn-on order according to a thermal code included in an input digital signal.

10 Claims, 5 Drawing Sheets

(58) Field of Classification Search
USPC .................................. 341/120, 118, 144, 155
See application file for complete search history.

(56) References Cited

U.S. PATENT DOCUMENTS

| | | |
|---|---|---|
| 11,038,517 B1 * | 6/2021 | Thinakaran ......... H03M 1/1028 |
| 2006/0114138 A1 | 6/2006 | Eloranta |
| 2016/0330049 A1 * | 11/2016 | Roh ........................ H04L 25/06 |

OTHER PUBLICATIONS

Ho et al. U.S. Appl. No. 17/728,178, filed Apr. 25, 2022 "Digital-to-analog conversion apparatus and method having signal calibration mechanism", US.

* cited by examiner

DIGITAL-TO-ANALOG CONVERSION CIRCUIT AND METHOD HAVING SIGNAL CALIBRATION MECHANISM

BACKGROUND OF THE INVENTION

1. Field of the Invention

The present invention relates to a digital-to-analog conversion circuit and a digital-to-analog conversion method having signal calibration mechanism.

2. Description of Related Art

A DAC circuit is an important circuit component that converts a signal from a digital form to an analog form. Based on different digital codes, the DAC circuit can multiply the digital codes by a corresponding conversion gain value to generate analog signals with different intensities.

However, for a current output type of the digital-to-analog conversion circuit, the process variation results in non-ideal offset of the amplitude and the shape of the signal. The offset of the amplitude particularly affects the system performance.

SUMMARY OF THE INVENTION

In consideration of the problem of the prior art, an object of the present invention is to supply a digital-to-analog conversion circuit and a digital-to-analog conversion method having signal calibration mechanism.

The present invention discloses a digital-to-analog conversion (DAC) circuit having signal calibration mechanism that includes a plurality of thermometer-controlled current sources and a control circuit. The thermometer-controlled current sources are configured to generate an output analog signal according to a total current. The control circuit is configured to retrieve a plurality of current offset values that the thermometer-controlled current sources correspond to and perform a sorting procedure on the current offset values to generate a turn-on order, wherein the current offset values are separated into a plurality of current offset groups according to the turn-on order, in which signs of each neighboring two of the current offset groups are opposite such that the current offset values cancel each other when the current sources turn on according to the turn-on order to keep an absolute value of a total current offset value of the current offset values not larger than a half of a largest absolute value. The control circuit is further configured to control the current sources to turn on based on the turn-on order according to a plurality of thermal codes comprised by an input digital signal.

The present invention also discloses a digital-to-analog conversion method having signal calibration mechanism used in a digital-to-analog conversion circuit that includes a plurality of thermometer-controlled current sources that generate an output analog signal according to a total current thereof and a control circuit. The digital-to-analog conversion method includes the steps outlined below. A plurality of current offset values that the thermometer-controlled current sources correspond to are retrieved by the control circuit. A sorting procedure is performed on the current offset values to generate a turn-on order by the control circuit, wherein the current offset values are separated into a plurality of current offset groups according to the turn-on order, in which signs of each neighboring two of the current offset groups are opposite such that the current offset values cancel each other when the current sources turn on according to the turn-on order in order to keep an absolute value of a total current offset value of the current offset values not larger than a half of a largest absolute value. The current sources are controlled to turn on based on the turn-on order by the control circuit according to a plurality of thermal codes comprised by an input digital signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a digital-to-analog conversion circuit and a digital-to-analog conversion method having signal calibration mechanism to generate a turn-on order of the current sources according to a sorting procedure such that the current offset values of the current sources cancel each other when the current sources turn on according to the turn-on order to accomplish a better linearity.

Figure 1:
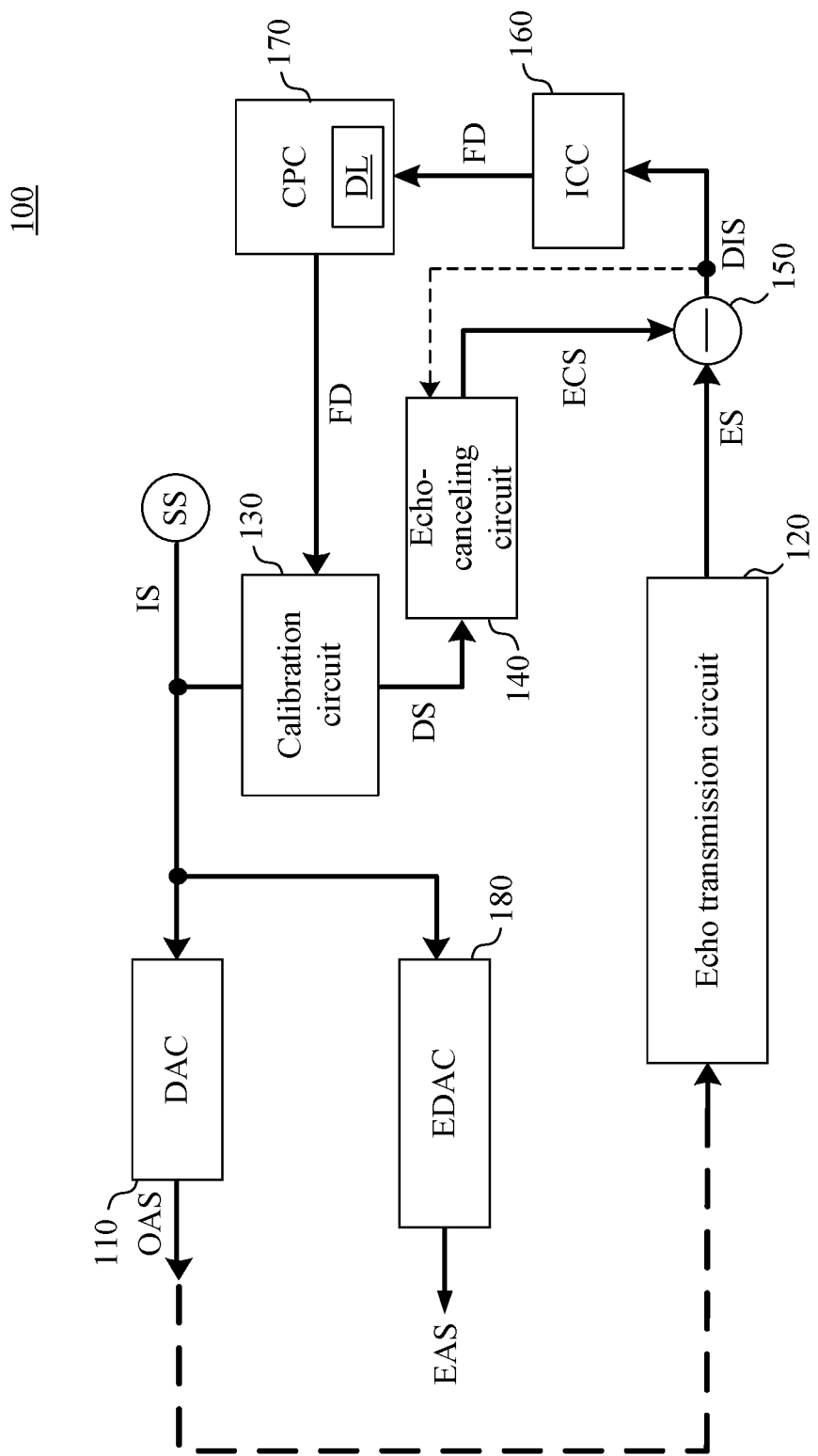
FIG. 1 illustrates a block diagram of a digital-to-analog conversion circuit having signal calibration mechanism according to an embodiment of the present invention.

Reference is now made to FIG. 1. FIG. 1 illustrates a block diagram of a digital-to-analog conversion (DAC) apparatus 100 having signal calibration mechanism according to an embodiment of the present invention. The DAC apparatus 100 includes a digital-to-analog conversion circuit 110 (abbreviated as DAC in FIG. 1), an echo transmission circuit 120, a calibration circuit 130, an echo-canceling circuit 140, an error calculating circuit 150, an inverted error calculating circuit 160 (abbreviated as ICC in FIG. 1), a calibration parameter calculating circuit 170 (abbreviated as CPC in FIG. 1) and an echo-canceling digital-to-analog conversion circuit 180 (abbreviated as EDAC in FIG. 1).

The digital-to-analog conversion circuit 110 receives an input digital signal IS from a signal source SS to generate an output analog signal OAS. The signal source SS is such as a transmission circuit (TX) of a communication system.

Figure 2:
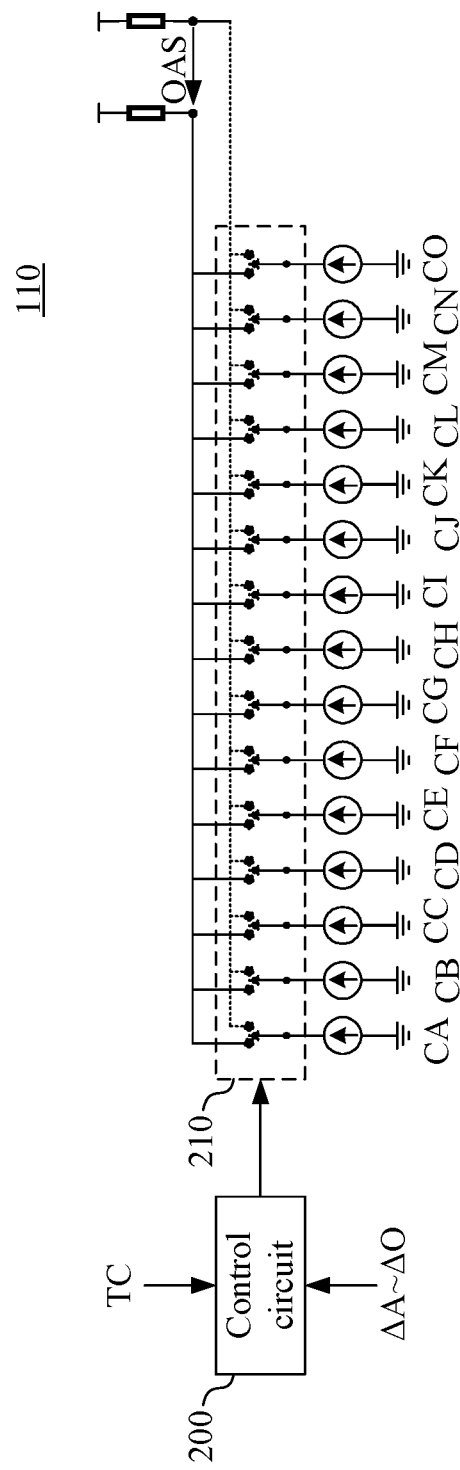
FIG. 2 illustrates a circuit diagram of the digital-to-analog conversion circuit according to an embodiment of the present invention.

FIG. 2 illustrates a circuit diagram of the digital-to-analog conversion circuit 110 according to an embodiment of the present invention. The digital-to-analog conversion circuit 110 includes a thermometer-controlled current sources CA~CO and a control circuit 200.

The input digital signal IS includes thermal codes TC such that the control circuit 200 controls the operation state of each of the thermometer-control current sources CA~CO to be one of a first current output state and a second current output state, so as to generate the output analog signal OAS according to a total current. Each of the current sources outputs the same amount of current but with opposite signs respectively under the operation of the first current output state and the second current output state.

In an embodiment, the control circuit 200 controls a switching circuit 210 according to the thermal codes TC such that the current sources CA~CO are electrically coupled to different current output paths, e.g., one of the solid-line path and dashed-line path in FIG. 2, so as to operate in one of the first current output state and the second current output state. In the present embodiment, 4 thermal codes having 16 combinations are used to control the thermometer-controlled current sources having the number of 15.

In operation, when the thermometer codes TC switch from the combinations of (0000), (0001), . . . to (1111) in order, the current sources CA~CO switch the operation state thereof in order like a thermometer. As a result, the operation of the current sources CA~CO starts from all being in the second current output state, through gradually switching the current sources CA to the current sources CN from the second current output state to the first current output state, to all being in the first current output state.

In other embodiments, the digital-to-analog conversion circuit 110 may include other binary-controlled current sources (not illustrated in the figure). The input digital signal IS may include binary codes to control these current sources such that the output analog signal OAS also include the current components of these current sources. The present invention is not limited thereto.

Figure 3:
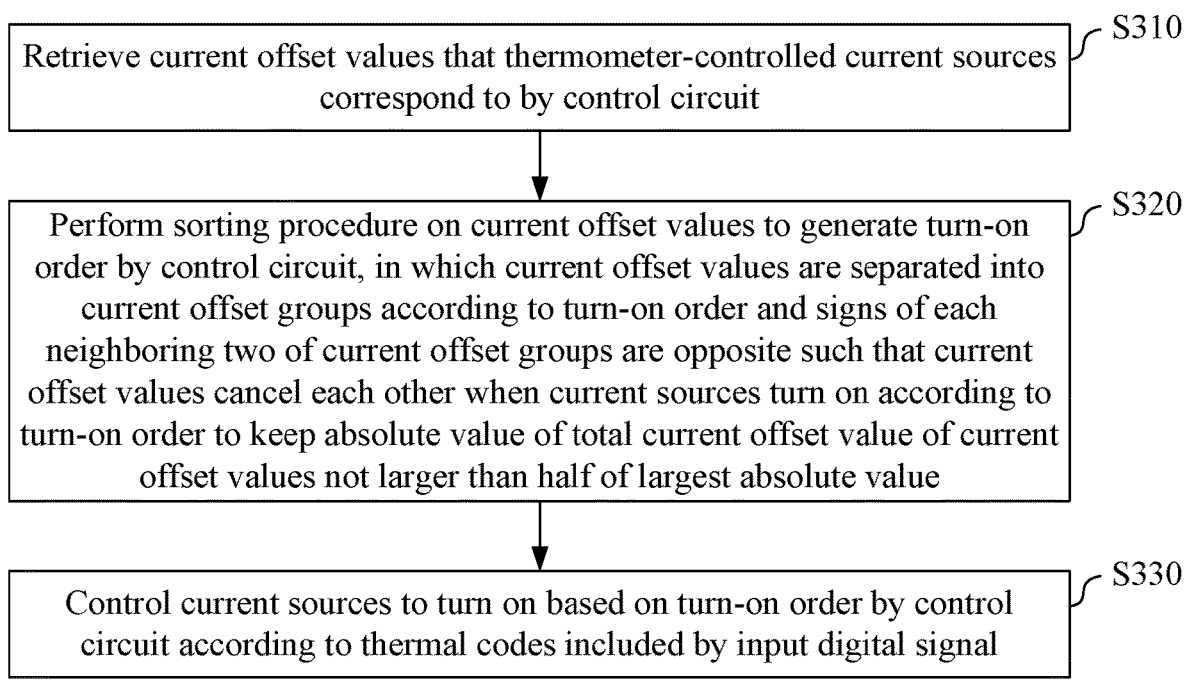
FIG. 3 illustrates a flow chart of a digital-to-analog conversion having signal calibration mechanism according to an embodiment of the present invention.

FIG. 3 illustrates a flow chart of a digital-to-analog conversion 300 having signal calibration mechanism according to an embodiment of the present invention. The digital-to-analog conversion 300 having signal calibration mechanism can be used in such as, but not limited to the digital-to-analog conversion circuit 110 illustrated in FIG. 2.

In step S310, the control circuit 200 retrieves a plurality of current offset values ΔA~ΔO that the thermometer-controlled current sources CA~CO correspond to. The current offset values ΔA~ΔO can be generated due to the process variation.

In an embodiment, the current offset values can be obtained based on the calculation of the difference value between signal transmission results of an external loop and an internal loop of the digital-to-analog conversion apparatus 100. The external loop transmits the output analog signal OAS through the echo transmission circuit 120 to generate an echo signal ES. The internal loop transmits the input digital signal IS through the calibration circuit 130 and the echo-canceling circuit 140 to generate an echo-canceling signal ECS.

The error calculating circuit 150 performs subtraction between the echo signal ES and the echo-canceling signal ECS to generate an error signal DIS. The inverted error calculating circuit 160 performs one-dimensional inversion on the echo-canceling coefficients CEC to further generate an inverted error value PD. The calibration parameter calculating circuit 170 makes the inverted error value FD serve as the offset amount that the input digital codeword corresponds to according to a path delay amount DL of the echo-canceling circuit 140 and the inverted error calculating circuit 160, in which a statistic operation is performed on the offset amount to generate the current offset values ΔA~ΔO to be fed to the control circuit 200. However, the present invention is not limited thereto.

In step S320, the control circuit 200 performs a sorting procedure on the current offset values ΔA~ΔO to generate a turn-on order. The current offset values ΔA~ΔO are separated into a plurality of current offset groups according to the turn-on order. Signs of each neighboring two of the current offset groups are opposite such that the current offset values cancel each other when the current sources turn on according to the turn-on order to keep an absolute value of a total current offset value of the current offset values not larger than a half of a largest absolute value.

Figure 4:
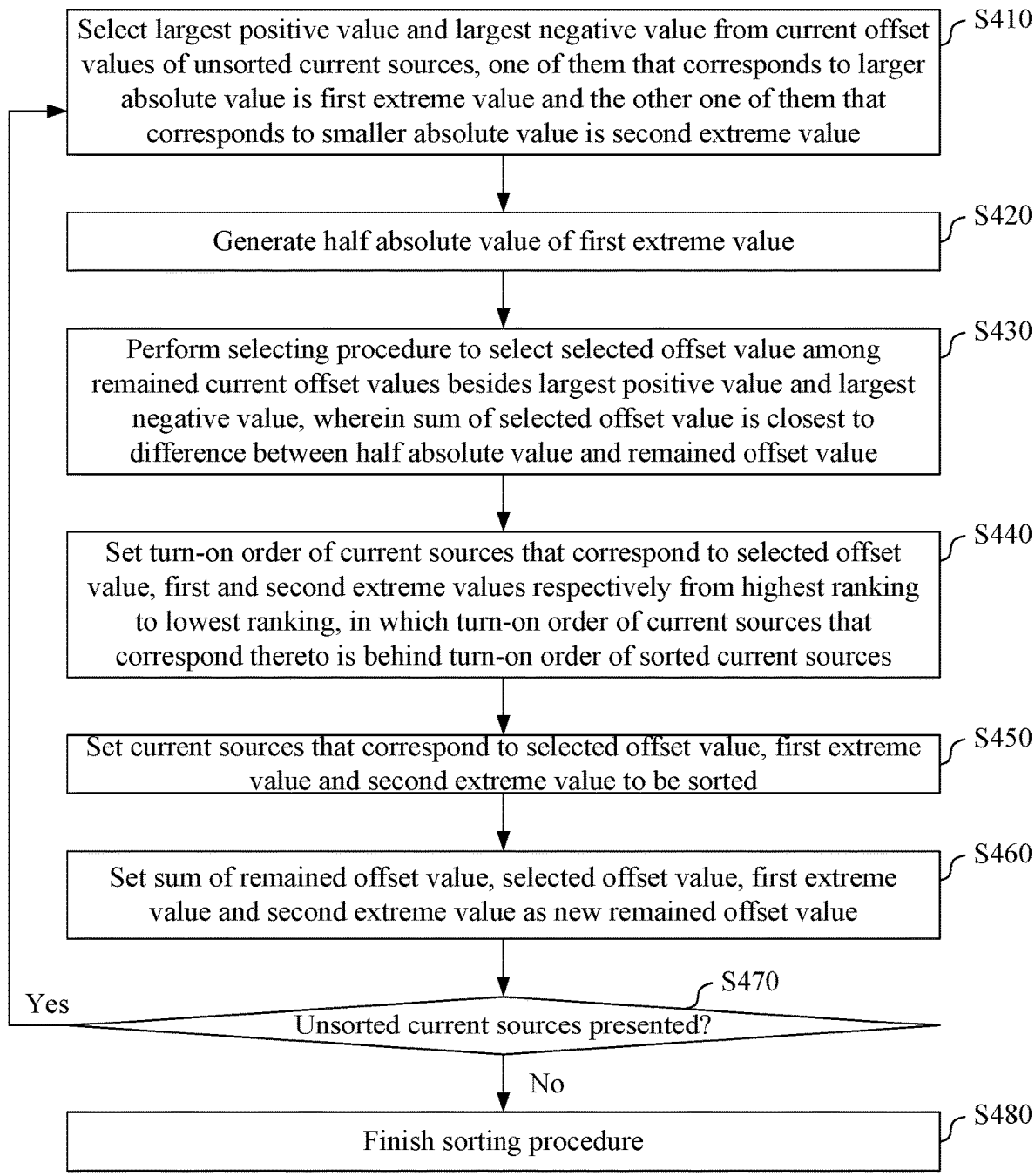
FIG. 4 illustrates a flow chart of a sorting procedure according to an embodiment of the present invention.

FIG. 4 illustrates a flow chart of a sorting procedure 400 according to an embodiment of the present invention. Table 1 illustrates numerical calculation results in different rounds of the sorting procedure according to an embodiment of the present invention.

TABLE 1

| | MP/MN | MA | INL | Offset value range | Offset value range (after modification) | Order |
|---|---|---|---|---|---|---|
| 1st round | +27/−28 | 14 | 0 | 13~15 | 1~3 | +12/+2/−28/+27 |
| 2nd round | +7/−13 | 6.5 | +13 | −7.5~−5.5 | −8.5~−4.5 | −5/−13/+7 |
| 3rd round | +4/−4 | 2 | +2 | −1~1 | N/A | 0/−4/+4 |
| 4th round | +3/−3 | 1.5 | +2 | −1.5~0.5 | N/A | −1/−3/+3 |
| 5th round | +1/−2 | 1 | +1 | −1~1 | N/A | N/A/−2/+1 |

The operation of the sorting procedure 400 is described in the following paragraphs in accompany with numerical examples.

In step S410, a largest positive value MP and a largest negative value MN are selected from the current offset values of the unsorted current sources. One of the largest positive value MP and the largest negative value MN that corresponds to a larger absolute value is a first extreme value, and the other one of the largest positive value MP and the largest negative value MN that corresponds to a smaller absolute value is a second extreme value.

In a numerical example, the current offset values that the current sources CA~CO correspond to are −28, −13, −5, −4, −3, −2, −1, 0, +1, +2, +3, +4, +7, +12 and +27. For the first round of the sorting procedure, the largest positive value MP is +27 and is the second extreme value. The largest negative value MN is −28 and is the first extreme value.

In step S420, a half absolute value MA of the first extreme value is generated.

Since the first extreme value is −28, the half absolute value MA thereof is |−28|/2=14.

In step S430, a selecting procedure is performed to select at least one selected offset value among a plurality of remained current offset values from the current offset values that remove the largest positive value MP and the largest negative value MN, wherein a sum of the selected offset value is closest to a difference between the half absolute value MA and a remained offset value INL.

Figure 5:
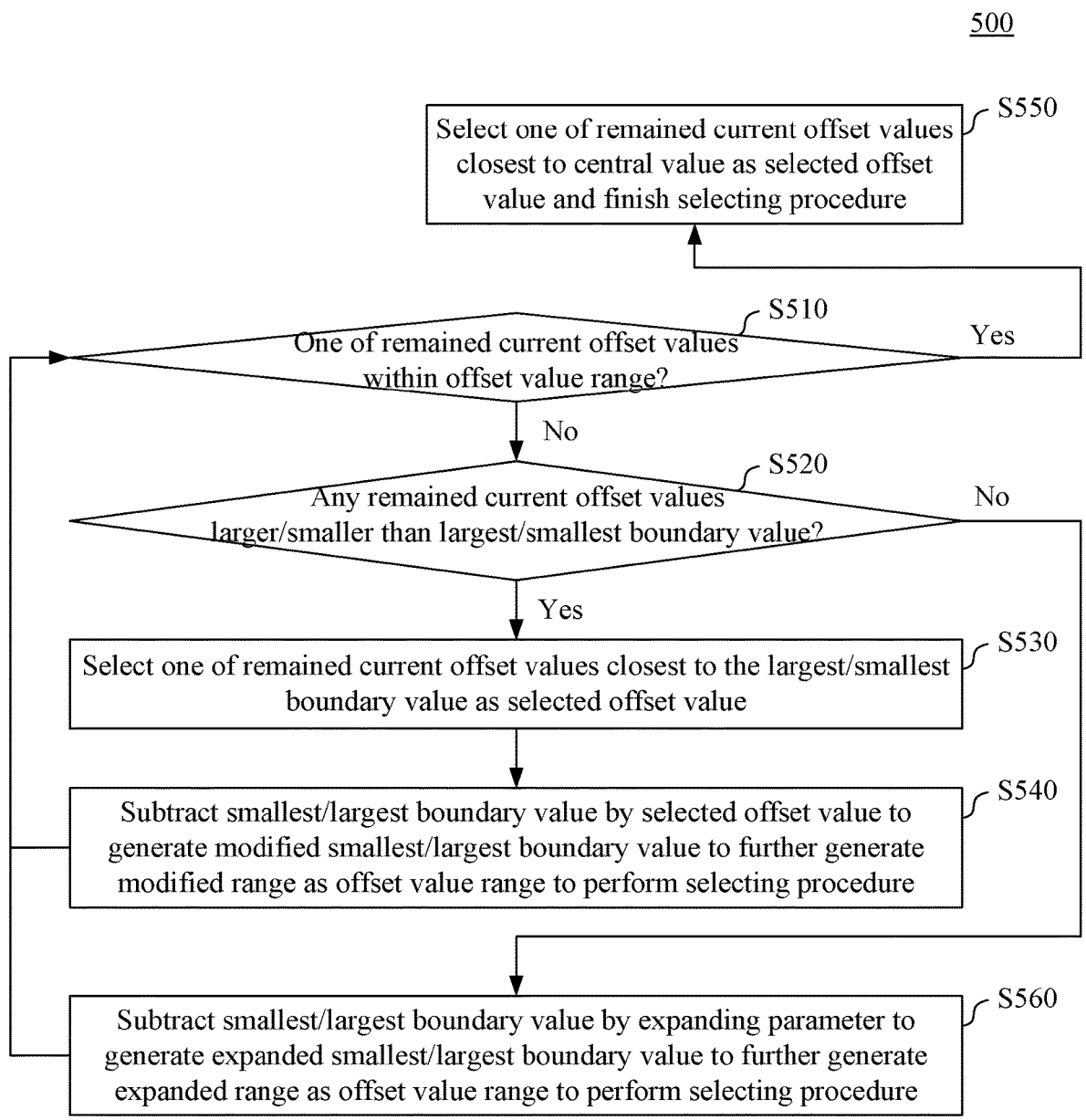
FIG. 5 illustrates a flow chart of a selecting procedure according to an embodiment of the present invention.

FIG. 5 illustrates a flow chart of a selecting procedure 500 according to an embodiment of the present invention.

In step S510, whether one of the remained current offset values except the largest positive value MP and the largest negative value MN is within an offset value range that has a central value as a center. The central value is predetermined to be a first difference value between the half absolute value and the remained offset value, wherein the offset value range has a largest boundary value and a smallest boundary value In an embodiment, offset value range is predetermined to be within a range of +1 and −1 around a central value, which is the first difference value described above. In the beginning of the sorting procedure, the remained offset value does not exist and is set to be 0. The first difference value is 14−0=14. The smallest boundary value of the offset value range is 14−1=13. The largest boundary value is 14+1=15. The offset value range is 13~15.

In step S520, when none of the remained current offset values is within the offset value range, whether at least one of the remained current offset values is larger than the largest boundary value under the condition that the first extreme value is the largest positive value MP, or whether at least one of the remained current offset values is smaller than the smallest boundary value under the condition that the first extreme value is the largest negative value MN is determined.

In step S530, when at least one of the remained current offset values is larger than the largest boundary value under the condition that the first extreme value is the largest positive value MP, one of the remained current offset values closest to the largest boundary value is selected as the selected offset value. When at least one of the remained current offset values is smaller than the smallest boundary value under the condition that the first extreme value is the largest negative value MN, one of the remained current offset values closest to smallest boundary value is selected as the selected offset value.

For the first round of the sorting procedure, none of the remained current offset values is within the original range and the first extreme value is the largest negative value MN. As a result, the current offset value +12 that is closest to the smallest boundary value 13 is selected to be the selected offset value.

In step S540, the smallest boundary value is subtracted by the selected offset value to generate a modified smallest boundary value and the largest boundary value is subtracted by the selected offset value to generate a modified largest boundary value to further generate a modified range having a second difference value between the central value and the selected offset value as the center according to the modified smallest boundary value and the modified largest boundary value, such that the modified range serves as the offset value range to perform the selecting procedure again.

For the first round of the sorting procedure, the modified smallest boundary value is 13−12=1. The modified largest boundary value is 15−12=3. The second difference value between the central value and the selected offset value is 14−12=2. The modified range is 1~3.

The flow goes back to step S510 to determine whether at least one of the remained current offset values is within the new offset value range.

In step S550, one of the remained current offset values closest to the central value is selected as the selected offset value and the selecting procedure is finished when one of the remained current offset values is within the offset value range.

For the first round of the sorting procedure, the current offset value+2 is within the modified offset value range 1~3 and is selected as the selected offset value. The selecting procedure is finished.

After the selecting procedure is finished, the flow goes back to step S440 of FIG. 4. The turn-on order of the current sources that correspond to the selected offset value, the first extreme value and the second extreme value are respectively set from a highest ranking to a lowest ranking, in which the turn-on order of the current sources that correspond to the selected offset value, the first extreme value and the second extreme value is behind the turn-on order of the sorted current sources.

For the first round of the sorting procedure, the turn-on order of the current sources CN, CJ, CA and CO that correspond to the selected offset values +12 and +2, the first extreme value −28 and the second extreme value+27 are respectively set from a highest ranking to a lowest ranking. Since none of the other current sources are sorted, the turn-on order of the current sources CN, CJ, CA, and CO have higher rankings than the turn-on order of the other current sources.

In step S450, the current sources that correspond to the selected offset value, the first extreme value and the second extreme value are set to be sorted.

For the first round of the sorting procedure, the current sources CN, CJ, CA and CO are set to be sorted.

In step S460, a sum of the remained offset value, the selected offset value, the first extreme value and the second extreme value is set as the new remained offset value.

For the first round of the sorting procedure, the sum of the selected offset values +12 and +2, the first extreme value −28 and the second extreme value+27, which is +12+2−28+27=+13, is set as the new remained offset value.

In step S470, whether unsorted current sources are presented is determined. When the unsorted current sources are presented, the flow goes back to step S410 to keep performing the second round of the sorting procedure.

For the second round of the sorting procedure, a largest positive value MP and a largest negative value MN are selected from the current offset values of the unsorted current sources CB~CI and CK~CM in step S410, in which the largest positive value MP is +7 and is the second extreme value, and the largest negative value MN is −13 and is the first extreme value. The half absolute value MA generated in step S420 is |−13|/2=6.5. The selecting procedure is further performed in step S430.

In the selecting procedure, the central value is predetermined to be the first difference value, which is 6.5−13=−6.5. The offset value range is predetermined to be in the range of +1 and −1 around the central value, which is −7.5~−5.5.

None of the remained current offset values except the largest positive value MP and the largest negative value MN is determined to be within the offset value range that has the central value as the center in step S510. None of the remained current offset values is determined to be smaller than the smallest boundary value in step S520 under the condition that the first extreme value is the largest negative value MN.

In step S560, the smallest boundary value is subtracted by an expanding parameter to generate an expanded smallest boundary value and the largest boundary value is added by the expanding parameter to generate an expanded largest boundary value, to further generate an expanded range that serves as the offset value range to perform the selecting procedure again.

In an embodiment, the expanding parameter is 1. As a result, for the second round of the sorting procedure, the expanded smallest boundary value is −7.5−1=−8.5. The expanded largest boundary value is −5.5+1=−4.5. The expanded range is −8.5~−4.5.

Under such a condition, the flow goes back to step S510 to determine whether one of the remained current offset values is within the offset value range 内. In step S550, one of the remained current offset values closest to the central value is selected as the selected offset value and the selecting procedure is finished when one of the remained current offset values is within the offset value range.

For the second round of the sorting procedure, in the remained current offset values, −5 is within the modified offset value range, which is −8.5~−4.5, and is selected as the selected offset value. The selecting procedure is finished.

After the selecting procedure is finished, the flow goes back to step S440 in FIG. 4. The turn-on order of the current sources CC, CB and CM that correspond to the selected offset value −5, the first extreme value −13 and the second extreme value +7 are respectively set from a highest ranking to a lowest ranking. The current sources CC, CB and CM are set to be sorted in step S450. The sum of the remained offset value+13, the selected offset value −5, the first extreme value −13 and the second extreme value+7, which is +2, is set as the new remained offset value. The unsorted current sources are determined to be presented in step S470. The flow goes back to step S410 to keep performing the third round of the sorting procedure.

Similarly, for the third round of the sorting procedure, a largest positive value MP and a largest negative value MN are selected from the current offset values of the unsorted current sources in step S410, in which the largest positive value MP is +4 and is the second extreme value, and the largest negative value MN is −4 and is the first extreme value. The half absolute value MA generated in step S420 is 2. The selecting procedure is further performed in step S430. In the selecting procedure, one of the remained current offset values except the largest positive value MP and the largest negative value MN is determined to be within the offset value range −1~+1 in step S510. The selected offset value 0 is selected in step S550 to finish the selecting procedure.

After the selecting procedure is finished, the flow goes back to step S440 in FIG. 4. The turn-on order of the current sources CH, CD and CL that correspond to the selected offset value 0, the first extreme value −4 and the second extreme value+4 are respectively set from a highest ranking to a lowest ranking. The current sources CH, CD and CL are set to be sorted in step S450. The sum of the remained offset value+2, the selected offset value 0, the first extreme value −4 and the second extreme value+4, which is +2, is set as the new remained offset value. The unsorted current sources are determined to be presented in step S470. The flow goes back to step S410 to keep performing the fourth round of the sorting procedure.

For the fourth round of the sorting procedure, a largest positive value MP and a largest negative value MN are selected from the current offset values of the unsorted current sources in step S410, in which the largest positive value MP is +3 and is the second extreme value, and the largest negative value MN is −3 and is the first extreme value. The half absolute value MA generated in step S420 is 1.5. The selecting procedure is further performed in step S430. In the selecting procedure, one of the remained current offset values except the largest positive value MP and the largest negative value MN is determined to be within the offset value range −0.5~+0.5 in step S510. The selected offset value −1 is selected in step S550 to finish the selecting procedure.

After the selecting procedure is finished, the flow goes back to FIG. 4. The turn-on order of the current sources CG, CE and CK that correspond to the selected offset value −1, the first extreme value −3 and the second extreme value+3 are respectively set from a highest ranking to a lowest ranking. The current sources CG, CE and CK are set to be sorted in step S450. The sum of the remained offset value+2, the selected offset value −1, the first extreme value −3 and the second extreme value +3, which is +1, is set as the new remained offset value. The unsorted current sources are determined to be presented in step S470. The flow goes back to step S410 to keep performing the fourth round of the sorting procedure.

For the fifth round of the sorting procedure, a largest positive value MP and a largest negative value MN are selected from the current offset values of the unsorted current sources in step S410, in which the largest positive value MP is +1 and is the second extreme value, and the largest negative value MN is −2 and is the first extreme value. The half absolute value MA generated in step S420 is 1. The selecting procedure is further performed in step S430.

In an embodiment, when none of the current offset values besides the largest positive value MP and the largest negative value MN is presented, 'none' can be an object to be selected. As a result, in the selecting procedure, one of the remained current offset values except the largest positive value MP and the largest negative value MN is determined to be within the offset value range −1~+1 in step S510. The selected offset value 'none' that does not correspond to any current source is selected in step S550 to finish the selecting procedure.

After the selecting procedure is finished, the flow goes back to FIG. 4. The turn-on order of the current sources CF and CI that correspond to the first extreme value −2 and the second extreme value+1 are respectively set from a highest ranking to a lowest ranking. The current sources CF and CI are set to be sorted in step S450. The sum of the remained offset value+1, the first extreme value −2 and the second extreme value+1, which is +0, is set as the new remained offset value. The unsorted current sources are determined to be absent in step S470. The sorting procedure is finished in step S480.

The sorted current offset values can be distinguished in to current offset groups having opposite signs based on the signs thereof, which are (+12, +2), (−28), (+27), (−5, −13), (+7), (0), (−4), (+4), (−1, −3), (+3), (−2) and (+1). The current offset values of each two of the neighboring current offset groups cancel each other when the current sources turn on according to the turn-on order to keep an absolute value of a total current offset value of the current offset values not larger than a half of a largest absolute value.

After the sorting procedure is finished, the flow goes back to FIG. 3. In step S330, the control circuit 200 controls the current sources CA~CO to turn on based on the turn-on order according to the thermal codes included by the input digital signal IS.

In the example described above, the final turn-on order makes the current sources turn on in the order of CN, CJ, CA, CO, CC, CB, CM, CH, CD, CL, CG, CE, CK, CF and CI according to the sorted current offset values.

In some approaches, the control circuit directly uses the thermal codes to control the current sources CA~CO to turn on according to a physical arrangement thereof. Under such a condition, based on the numerical examples described above, the current sources CI~CO that turn on first keep accumulating the current offset values that are positive values, until the current sources CA~CG that turn on later to cancel the positive accumulated offset based on the current offset values thereof that are negative values. The output analog signal OAS cannot keep a good linearity.

On the contrary, the digital-to-analog conversion circuit and the digital-to-analog conversion method of the present invention can keep the absolute value of the total current offset value of the current offset values not larger than the half of the largest absolute value by using the mechanism described above. A better linearity can be obtained.

It is appreciated that the sorting procedure and the selecting procedure described above is merely an example. In other embodiments, other sorting and selecting mechanisms can be used to generate the turn-on order. The present invention is not limited thereto.

In an embodiment, the echo-canceling digital-to-analog conversion apparatus 180 included in the digital-to-analog conversion apparatus 100 in FIG. 1 is disposed between the digital-to-analog conversion apparatus 100 and a receiving circuit (RX, not illustrated in the figure) of a communication system. The echo-canceling digital-to-analog conversion apparatus 180 generates an echo-canceling output analog signal EAS according to the input digital signal IS to cancel the output analog signal OAS generated by the digital-to-analog conversion circuit 110 to avoid the effect of the output analog signal OAS on the receiving circuit.

The echo-canceling digital-to-analog conversion apparatus 180 may include a configuration the same as that of the digital-to-analog conversion circuit 110. In other words, the echo-canceling digital-to-analog conversion apparatus 180 may also include thermometer-controlled current sources and a control circuit. The detail configuration is not described and illustrated herein. However, since the two digital-to-analog conversion circuits are independent, the echo-canceling current sources of the echo-canceling digital-to-analog conversion apparatus 180 may have echo-canceling current offset values different from the current offset values of the digital-to-analog conversion circuit 110.

In an embodiment, the control circuit in the echo-canceling digital-to-analog conversion apparatus 180 may perform the procedures identical to those described above to perform sorting so as to control the turn-on order of the current sources. In another embodiment, the control circuit of the echo-canceling digital-to-analog conversion apparatus 180 may perform an echo-canceling sorting procedure. The echo-canceling sorting procedure approximates an echo-canceling sorting result of the echo-canceling current offset values of the current sources of the echo-canceling digital-to-analog conversion apparatus 180 to the sorting result of the current offset values of the current sources of the digital-to-analog conversion circuit 110, such that the linearity trends of the digital-to-analog conversion circuit 110 and the echo-canceling digital-to-analog conversion apparatus 180 are the same.

It is appreciated that the embodiments described above are merely an example. In other embodiments, it should be appreciated that many modifications and changes may be made by those of ordinary skill in the art without departing, from the spirit of the disclosure.

In summary, the present invention discloses the digital-to-analog conversion apparatus and the digital-to-analog conversion method to generate a turn-on order of the current sources according to a sorting procedure such that the current offset values of the current sources cancel each other when the current sources turn on according to the turn-on order to accomplish a better linearity.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital-to-analog conversion (DAC) circuit having signal calibration mechanism, comprising:
   a plurality of thermometer-controlled current sources configured to generate an output analog signal according to a total current; and
   a control circuit configured to retrieve a plurality of current offset values that the thermometer-controlled current sources correspond to and perform a sorting procedure on the current offset values to generate a turn-on order, wherein the current offset values are separated into a plurality of current offset groups according to the turn-on order, in which signs of each neighboring two of the current offset groups are opposite such that the current offset values cancel each other when the current sources turn on according to the turn-on order to keep an absolute value of a total current offset value of the current offset values not larger than a half of a largest absolute value;
   wherein the control circuit is further configured to control the current sources to turn on based on the turn-on order according to a plurality of thermal codes comprised by an input digital signal.

2. The digital-to-analog conversion circuit of claim 1, wherein the sorting procedure comprises:
   selecting a largest positive value and a largest negative value from the current offset values of the unsorted current sources, wherein one of the largest positive value and the largest negative value that corresponds to a larger absolute value is a first extreme value, and the other one of the largest positive value and the largest negative value that corresponds to a smaller absolute value is a second extreme value;
   generating a half absolute value of the first extreme value;
   performing a selecting procedure to select at least one selected offset value among a plurality of remained current offset values from the current offset values that remove the largest positive value and the largest negative value, wherein a sum of the selected offset value is closest to a difference between the half absolute value and a remained offset value;
   setting the turn-on order of the current sources that correspond to the selected offset value, the first extreme value and the second extreme value respectively from a highest ranking to a lowest ranking, in which the turn-on order of the current sources that correspond to the selected offset value, the first extreme value and the second extreme value is behind the turn-on order of the sorted current sources;
   setting the current sources that correspond to the selected offset value, the first extreme value and the second extreme value to be sorted;
   setting a sum of the remained offset value, the selected offset value, the first extreme value and the second extreme value as the new remained offset value; and
   keeping performing the sorting procedure when the unsorted current sources are presented, and finishing performing the sorting procedure when the unsorted current sources are absent.

3. The digital-to-analog conversion circuit of claim 2, wherein the selecting procedure comprises:
   determining whether one of the remained current offset values is within an offset value range that has a central value as a center, wherein the central value is predetermined to be a first difference value between the half absolute value and the remained offset value, wherein the offset value range has a largest boundary value and a smallest boundary value;

selecting one of the remained current offset values closest to the central value as the selected offset value and finishing the selecting procedure when one of the remained current offset values is within the offset value range;

selecting one of the remained current offset values closest to the largest boundary value as the selected offset value under the condition that the first extreme value is the largest positive value and selecting one of the remained current offset values closest to the smallest boundary value as the selected offset value under the condition that the first extreme value is the largest negative value when none of the remained current offset values is within the offset value range; and subtracting the smallest boundary value by the selected offset value to generate a modified smallest boundary value and subtracting the largest boundary value by the selected offset value to generate a modified largest boundary value, to further generate a modified range having a second difference value between the central value and the selected offset value as the center according to the modified smallest boundary value and the modified largest boundary value, such that the modified range serves as the offset value range to perform the selecting procedure again.

4. The digital-to-analog conversion circuit of claim 3, wherein the selecting procedure further comprises:

subtracting the smallest boundary value by an expanding parameter to generate an expanded smallest boundary value and adding the largest boundary value by the expanding parameter to generate an expanded largest boundary value, to further generate an expanded range that serves as the offset value range to perform the selecting procedure again when none of the remained current offset values is within the offset value range and when either a first condition that the first extreme value is the largest positive value and none of the remained current offset values is larger than the largest boundary value occurs or a second condition that the first extreme value is the largest negative value and none of the remained current offset values is smaller than the smallest boundary value occurs.

5. The digital-to-analog conversion circuit of claim 1, wherein the digital-to-analog conversion circuit is used in a digital-to-analog conversion apparatus that further comprises an echo-canceling digital-to-analog conversion circuit, and the echo-canceling digital-to-analog conversion circuit comprises:

a plurality of thermometer-controlled echo-canceling current sources; and an echo-canceling control circuit configured to perform an echo-canceling sorting procedure on a plurality of echo-canceling current offset values that the thermometer-controlled echo-canceling current sources correspond to so as to generate an echo-canceling turn-on order, and configured to control the echo-canceling current sources to turn on based on the echo-canceling turn-on order according to the thermal codes comprised by the input digital signal, wherein the echo-canceling sorting procedure approximates an echo-canceling sorting result of the echo-canceling current offset values to a sorting result of the current offset values.

6. A digital-to-analog conversion method having signal calibration mechanism used in a digital-to-analog conversion circuit that comprises a plurality of thermometer-controlled current sources that generate an output analog signal according to a total current thereof and a control circuit, the digital-to-analog conversion method comprising:

retrieving a plurality of current offset values that the thermometer-controlled current sources correspond to by the control circuit;

performing a sorting procedure on the current offset values to generate a turn-on order by the control circuit, wherein the current offset values are separated into a plurality of current offset groups according to the turn-on order, in which signs of each neighboring two of the current offset groups are opposite such that the current offset values cancel each other when the current sources turn on according to the turn-on order to keep an absolute value of a total current offset value of the current offset values not larger than a half of a largest absolute value; and controlling the current sources to turn on based on the turn-on order by the control circuit according to a plurality of thermal codes comprised by an input digital signal.

7. The digital-to-analog conversion method of claim 6, wherein the sorting procedure comprises:

selecting a largest positive value and a largest negative value from the current offset values of the unsorted current sources, wherein one of the largest positive value and the largest negative value that corresponds to a larger absolute value is a first extreme value, and the other one of the largest positive value and the largest negative value that corresponds to a smaller absolute value is a second extreme value;

generating a half absolute value of the first extreme value;

performing a selecting procedure to select at least one selected offset value among a plurality of remained current offset values from the current offset values that remove the largest positive value and the largest negative value, wherein a sum of the selected offset value is closest to a difference between the half absolute value and a remained offset value;

setting the turn-on order of the current sources that correspond to the selected offset value, the first extreme value and the second extreme value respectively from a highest ranking to a lowest ranking, in which the turn-on order of the current sources that correspond to the selected offset value, the first extreme value and the second extreme value is behind the turn-on order of the sorted current sources;

setting the current sources that correspond to the selected offset value, the first extreme value and the second extreme value to be sorted;

setting a sum of the remained offset value, the selected offset value, the first extreme value and the second extreme value as the new remained offset value; and keeping performing the sorting procedure when the unsorted current sources are presented, and finishing performing the sorting procedure when the unsorted current sources are absent.

8. The digital-to-analog conversion method of claim 7, wherein the selecting procedure comprises:

determining whether one of the remained current offset values is within an offset value range that has a central value as a center, wherein the central value is predetermined to be a first difference value between the half absolute value and the remained offset value, wherein the offset value range has a largest boundary value and a smallest boundary value;

selecting one of the remained current offset values closest to the central value as the selected offset value and finishing the selecting procedure when one of the remained current offset values is within the offset value range;

selecting one of the remained current offset values closest to the largest boundary value as the selected offset value under the condition that the first extreme value is the largest positive value and selecting one of the remained current offset values closest to the smallest boundary value as the selected offset value under the condition that the first extreme value is the largest negative value when none of the remained current offset values is within the offset value range; and subtracting the smallest boundary value by the selected offset value to generate a modified smallest boundary value and subtracting the largest boundary value by the selected offset value to generate a modified largest boundary value, to further generate a modified range having a second difference value between the central value and the selected offset value as the center according to the modified smallest boundary value and the modified largest boundary value, such that the modified range serves as the offset value range to perform the selecting procedure again.

9. The digital-to-analog conversion method of claim 8, wherein the selecting procedure further comprises:

subtracting the smallest boundary value by an expanding parameter to generate an expanded smallest boundary value and adding the largest boundary value by the expanding parameter to generate an expanded largest boundary value, to further generate an expanded range that serves as the offset value range to perform the selecting procedure again when none of the remained current offset values is within the offset value range and when either a first condition that the first extreme value is the largest positive value and none of the remained current offset values is larger than the largest boundary value occurs or a second condition that the first extreme value is the largest negative value and none of the remained current offset values is smaller than the smallest boundary value occurs.

10. The digital-to-analog conversion method of claim 6, wherein the digital-to-analog conversion circuit is used in a digital-to-analog conversion apparatus that further comprises an echo-canceling digital-to-analog conversion circuit, and the echo-canceling digital-to-analog conversion circuit comprises a plurality of thermometer-controlled echo-canceling current sources and an echo-canceling control circuit, the digital-to-analog conversion method further comprises:

performing an echo-canceling sorting procedure on a plurality of echo-canceling current offset values that the thermometer-controlled echo-canceling current sources correspond to so as to generate an echo-canceling turn-on order, and controlling the echo-canceling current sources to turn on based on the echo-canceling turn-on order according to the thermal codes comprised by the input digital signal by the echo-canceling control circuit, wherein the echo-canceling sorting procedure approximates an echo-canceling sorting result of the echo-canceling current offset values to a sorting result of the current offset values.

* * * * *